United States Patent
Grigg et al.

(10) Patent No.: US 6,534,342 B2
(45) Date of Patent: *Mar. 18, 2003

(54) METHOD OF MANUFACTURING LOC SEMICONDUCTOR ASSEMBLED WITH ROOM TEMPERATURE ADHESIVE

(75) Inventors: Ford B. Grigg, Meridian, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/067,592

(22) Filed: Feb. 4, 2002

(65) Prior Publication Data

US 2002/0090751 A1 Jul. 11, 2002

Related U.S. Application Data

(63) Continuation of application No. 09/795,889, filed on Feb. 28, 2001, which is a continuation of application No. 09/176,967, filed on Oct. 22, 1998, now Pat. No. 6,248,611, which is a continuation of application No. 08/916,977, filed on Aug. 14, 1997, now Pat. No. 5,840,598.

(51) Int. Cl.$^7$ .............................................. H01L 21/44
(52) U.S. Cl. ...................................... 438/118; 428/123
(58) Field of Search ................................ 438/106, 118, 438/123, 258, 455

(56) References Cited

U.S. PATENT DOCUMENTS

| | | |
|---|---|---|
| 4,934,820 A | 6/1990 | Takahashi et al. |
| 4,937,656 A | 6/1990 | Kohara |
| 5,073,521 A | 12/1991 | Braden |
| 5,256,598 A | 10/1993 | Farnworth et al. |
| 5,286,679 A | 2/1994 | Farnworth et al. |
| 5,304,582 A | 4/1994 | Ogawa |
| 5,304,842 A | 4/1994 | Farnworth et al. |
| 5,350,811 A | 9/1994 | Ichimura et al. |
| 5,366,933 A | 11/1994 | Golwalkar et al. |
| 5,407,502 A | 4/1995 | Takenaka et al. |
| 5,441,918 A | 8/1995 | Morisaki et al. |
| 5,446,080 A | 8/1995 | Shima et al. |
| 5,506,446 A | 4/1996 | Hoffman et al. |
| 5,548,160 A | 8/1996 | Corbett et al. |
| 5,627,108 A | 5/1997 | Alibocus et al. |
| 5,755,867 A | 5/1998 | Chikuni et al. |
| 5,840,598 A | 11/1998 | Grigg et al. |
| 5,863,988 A | 1/1999 | Hashimoto et al. |
| 5,872,398 A | 2/1999 | King et al. |
| 5,959,347 A | 9/1999 | Grigg et al. |
| 5,982,041 A * | 11/1999 | Mitani et al. ................ 257/783 |
| 6,011,220 A | 1/2000 | Bando et al. |
| 6,012,502 A | 1/2000 | VanNortwick et al. |

* cited by examiner

Primary Examiner—David Nelms
Assistant Examiner—Thao P Le
(74) Attorney, Agent, or Firm—TraskBritt

(57) ABSTRACT

A method of making a semiconductor device assembly having a lead frame and a semiconductor device configured to be attached to each other. An adhesive is applied at room temperature through a stencil to the lead frame. The semiconductor device is urged against the adhesive to effect the attachment between the semiconductor device and the lead frame. The adhesive preferably is from about 75 percent to about 95 percent isobutyl acetal diphenol copolymer and from about 25 percent to about 5 percent, respectively, of titanium oxide.

10 Claims, 3 Drawing Sheets

METHOD OF MANUFACTURING LOC SEMICONDUCTOR ASSEMBLED WITH ROOM TEMPERATURE ADHESIVE

CROSS-REFERENCE TO RELATED APPLICATION

This application is a continuation of application Ser. No. 09/795,889, filed Feb. 28, 2001, pending, which is a continuation of application Ser. No. 09/176,967, filed Oct. 22, 1998, now U.S. Pat. No. 6,248,611, issued Jun. 19, 2001, which is a continuation of application Ser. No. 08/916,977, filed Aug. 14, 1997, now U.S. Pat. No. 5,840,598, issued Nov. 24, 1998.

BACKGROUND OF THE INVENTION

1. Field of the Invention

This invention relates to the manufacture of semiconductor device assemblies and, more particularly, to methods of assembly of semiconductor devices using room temperature adhesives and to the assembled semiconductor device and lead frame using room temperature adhesives.

2. State of the Art

To manufacture a semiconductor device assembly, a semiconductor device, typically called a die or chip, is typically attached to a lead frame. A lead frame is a structure having a plurality of leads, bus bars, or other connecting structure to be electrically connected with the semiconductor device. In a conventional lead frame, the lead frame includes a die paddle to which the semiconductor device is attached and a plurality of leads extending inwardly to surround the periphery of a semiconductor device mounted on the die paddle. Subsequently, a plurality of wire bonds are made to connect the bond pads on the active surface of the semiconductor device to the ends of the leads extending around the periphery of the semiconductor device. In a leads-over-chip type lead frame (LOC lead frame), the lead frame is formed having no die paddle and having a plurality of leads which extends over the active surface of the semiconductor device being secured thereto to support the semiconductor device, with a plurality of wire bonds being formed between the bond pads on the active surface of the semiconductor device and the ends of the leads of the lead frame.

A conventional lead frame or LOC frame may serve other functions. That is, it may assist in heat dissipation during manufacture, increase the structural strength of the assembled semiconductor device as well as provide convenient locations to make electrical connections.

In order to attach the semiconductor device to the lead frame, different adhesives and adhesively coated tapes have been suggested. For example, U.S. Pat. No. 5,304,582 (Ogawa) shows use of adhesive tape with different adhesives on opposite sides for attaching a die to a lead frame. U.S. Pat. No. 5,548,160 (Corbett et al.) discloses use of adhesives including adhesives that have a core.

Typically, in attaching a LOC lead frame to a semiconductor device, a double-coated adhesive tape is applied between the active surface of the semiconductor device and the lead frame. The adhesive tape is typically an insulating carrier with a polymer adhesive on both sides to mechanically interconnect the lead frame and the semiconductor device. The tape composition and the amount of polymer adhesive used on the tape varies with the size of the semiconductor device. It is desired to use the least amount of adhesively coated tape to attach a semiconductor device to a lead frame to attempt to minimize problems. Too much polymer adhesive added to the tape can cause a coefficient of thermal expansion mismatch between the lead frame, the polymer adhesive and the semiconductor device which can contribute to the failure of the packaged device. Reducing the size of the tape to enhance performance may involve reprocessing the tape at some increased cost and at some difficulty for the smaller sizes. U.S. Pat. No. 5,548,160 (Corbett et al.)

If an adhesive, as opposed to an adhesively coated tape, is used to attach the semiconductor device to the lead frame, the quantity of adhesive must be carefully controlled in the dispensing process. The bond time for the adhesive is recognized to be difficult to control and can vary greatly with variations in adhesive viscosity, adhesive application temperature and amount of adhesive used. Further, adhesive can bleed from under the lead finger and interfere with the attachment of other lead fingers of the lead frame. Also, use of an adhesive (at elevated temperatures) may also lead to a nonuniform bond line between the semiconductor device and the lead frame. That is, the semiconductor device is not generally in alignment with the lead frame, causing different spacings to be present between the lead fingers and the bond pads on the active surface of the semiconductor device, thereby affecting wire bonding operations. Additionally, uneven application of adhesive or non-uniform adhesive viscosity can lead to tilting of the semiconductor device relative to the lead frame. An uneven or tilted relationship has been determined to be a factor that reduces semiconductor device assembly quality and leads to failures.

Therefore, an adhesive with better qualities suitable for direct bonding of the semiconductor device to the lead fingers of a lead frame is desirable.

BRIEF SUMMARY OF THE INVENTION

A semiconductor device assembly is formed by joining a lead frame and a semiconductor device. The lead frame includes a plurality of lead fingers, each lead finger having a lower attaching surface for adhesive attachment to portions of the active surface of a semiconductor device.

A non-conductive polymer adhesive is selected from the group of adhesives that is tacky and compliant at room temperature, easily applied to a substrate, such as through the use of a stencil, and easily cured to a predetermined degree. The non-conductive polymer is applied, at room temperature, either to the lower surface of the lead fingers of the lead frame or to portions of the active surface of the semiconductor device for compression therebetween. The lead fingers are connected by wire bonds to the bond pads on the active surface of the semiconductor device.

The adhesive preferably has a first copolymer material selected from the group of copolymers that includes isobutyl compounds and a second material that is from a group of metal oxides that includes titanium dioxide. Preferably, the first material is isobutyl acetal diphenol copolymer. More preferably, the second material is titanium dioxide.

In a preferred composition, the adhesive has about 75 percent to about 95 percent of isobutyl acetal diphenol copolymer and, respectively, from about 25 percent to about 5 percent of titanium dioxide.

Methods of assembling the semiconductor device assembly include providing a lead frame and a semiconductor device. A non-conductive polymer adhesive is selected from the group that is tacky and compliant at room temperature and is applicable to a substrate through a stencil. The adhesive is applied to one of the semiconductor device and a surface of the lead frame at room temperature. The lead frame and the semiconductor device are urged together at room temperature to attach the semiconductor device to the lead frame and with electrical connections between the lead fingers of the lead frame and the bond pads on the active surface of the semiconductor device made by wire bonds extending therebetween.

In the preferred methods of assembly, the adhesive may be from the groups of adhesives as described hereinbefore.

In an alternate configuration, a stencil is provided with the adhesive, at room temperature, applied to either a surface of each lead finger of the lead fingers or portions of the active surface of the semiconductor device. The lead frame and the semiconductor device are thereafter positioned relative to each other and urged together to effect attachment and electrical connection, if desired.

BRIEF DESCRIPTION OF THE SEVERAL VIEWS OF THE DRAWINGS

In the drawings which illustrate what are regarded as the best modes and preferred embodiments for carrying out the invention.

DETAILED DESCRIPTION OF THE INVENTION

Figure 1:
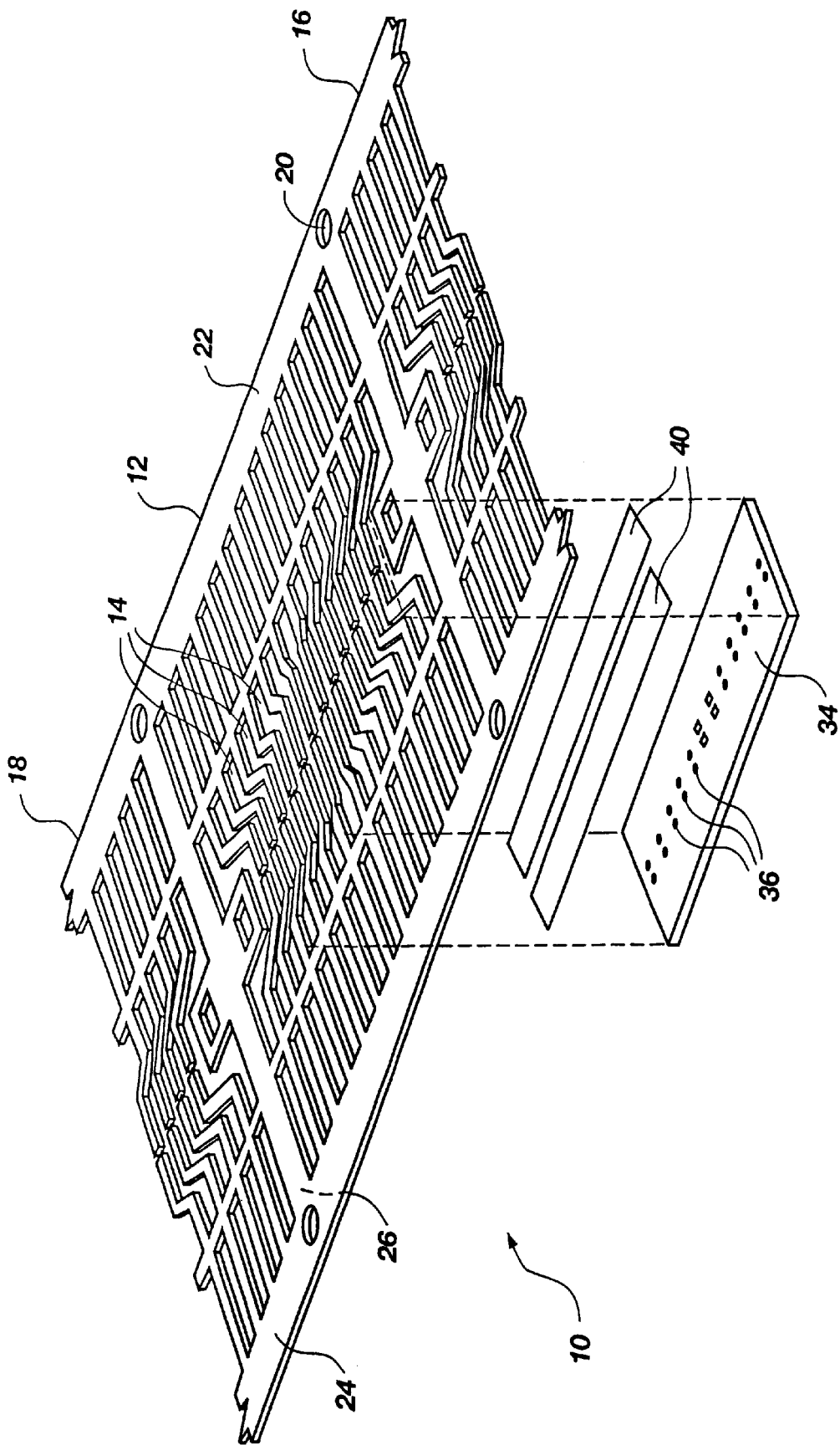
FIG. 1 is a perspective simplified illustration of a semiconductor device assembly of the invention.

Referring to drawing FIG. 1, a semiconductor device assembly 10 includes a lead frame 12 having a plurality of lead fingers 14 thereon. The lead frame 12 is one of a plurality that is connected in end-to-end fashion, thereby forming a strip or roll of lead frames. That is, lead frame 12 is positioned between a preceding frame 16 and a following frame 18. The lead frame 12 as well as the preceding frame 16 and following frame 18 are driven or moved through a manufacturing environment by an appropriate drive or indexing system that engages the apertures 20 formed in the opposite edges, or rails, 22 and 24. At a convenient time, the lead frames 12, 16 and 18 are separated one from the other and the opposite edges, or rails, 22 and 24 are removed so that each frame with a semiconductor device attached thereto becomes a separate and useable semiconductor device assembly.

Each lead frame 12 is formed having a plurality of lead fingers 14, each lead finger 14 having a lower surface, i.e., an undersurface or attaching surface 26. In some instances, the bond pads 36 of the semiconductor device 34 may include bumps thereon to mate with each of the lead fingers 14 of the lead frame 12.

As illustrated in drawing FIG. 1, the semiconductor device 34 is any suitable semiconductor device configured for attachment to the lead frame 12. The semiconductor device 34 has portions, bond pads 36, on the active surface thereof configured for electrical connection to the lead fingers 14 of a lead frame 12. As illustrated, the semiconductor device 34 has a plurality of bond pads 36 thereon, all suitably positioned so that, upon proper positioning of the semiconductor device 34 with respect to the leads of a lead frame, the bond pads 36 are available for further connection. The semiconductor device 34 may also have additional bond pads thereon.

Adhesive 40 is used to attach the lead frame 12 and the semiconductor device 34 together. As shown in FIG. 1, the adhesive 40 may be applied in a line or in a plurality of beads positioned for effecting attachment of the semiconductor device 34 to the attaching surface 26 of the lead fingers 14 of the lead frame 12.

In operation, the adhesive 40 is preferably applied to an attaching surface 26 of the lead fingers 14 of the lead frame 12. That is, the adhesive 40 is positioned on the attaching surface by any appropriate nozzle, roller, glue gun tip or the like. Upon urging the semiconductor device 34 and the lead frame 12 together, the adhesive 40 is compressed and spread horizontally to effect an attachment. Since the adhesive is preferably at room temperature, viscosity and flow is typically constant throughout the adhesive. In turn, the risk of an uneven relationship between the semiconductor device and the lead frame is reduced as the semiconductor device and lead frame are assembled. Further, application at room temperature of the adhesive reduces heat induced failures in the semiconductor device and lead frame assembly arising during the assembly operations.

Figure 2:
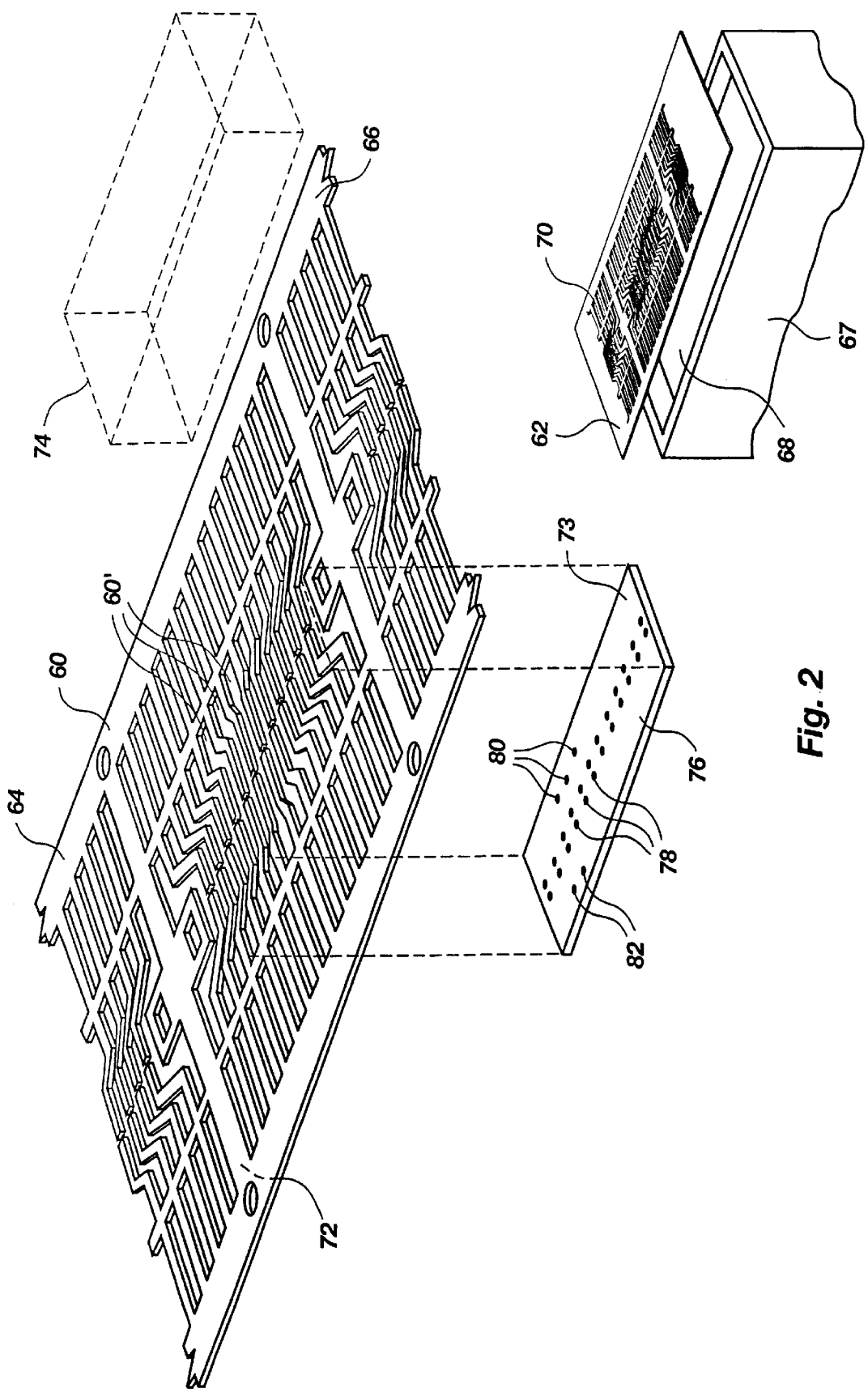
FIG. 2 is a perspective simplified illustration of a semiconductor device assembly of the invention with a stencil for applying adhesive.

As illustrated in drawing FIG. 2, the lead frame 60 is the same as lead frame 12. The lead frame 60 is positioned to pass relative to a stencil 62. That is, a drive or indexing means (not shown) urges the lead frame 60 as well as the preceding frame 64 and the following frame 66 to move past the stencil 62. A source 67 of adhesive 68 is illustrated separate from the stencil 62 for clarity. In normal use, the stencil 62 is positioned so that adhesive 68 from the source 67 is urged through the apertures 70 of the stencil 62 (by, for example, a piston) and onto the underside or attachment surface 72 of the lead frame 60. The stencil 62 may be configured with any desired pattern of apertures for deposition of adhesive 68 on an attaching surface 72 of the lead frame 60. Of course, the adhesive may also be deposited on the active surface 73 of the semiconductor device 76.

The source 67 with stencil 62 and adhesive 68 may move up and down relative to the attaching surface 72 to apply the adhesive 68 thereto. An anvil block 74 may be positioned opposite the stencil 62 so that the lead frames 60, 64 and 66 are all properly supported upon movement of the stencil 62 in close proximity and upon operation of the source 67 to urge the adhesive 68 outwardly to and in contact with the attaching surface 72. A similar anvil block may be positioned so that the lead frame 60 is supported upon movement of the semiconductor device 76 into contact with the adhesive on the attaching surface 72 of the lead frame 60 and further upon compression of the adhesive 68 as the active surface 73 of the semiconductor device 76 is urged toward the attaching surface 72 of the lead frame 60. As the active surface 73 of the semiconductor device 76 comes into contact with the attaching surface 72, bond pads 78, 80 and 82 located on the active surface 73 of the semiconductor device 76 are positioned to effect electrical connection with corresponding lead fingers 60' of the lead frame 60 as desired using wire bonds.

Figure 3:
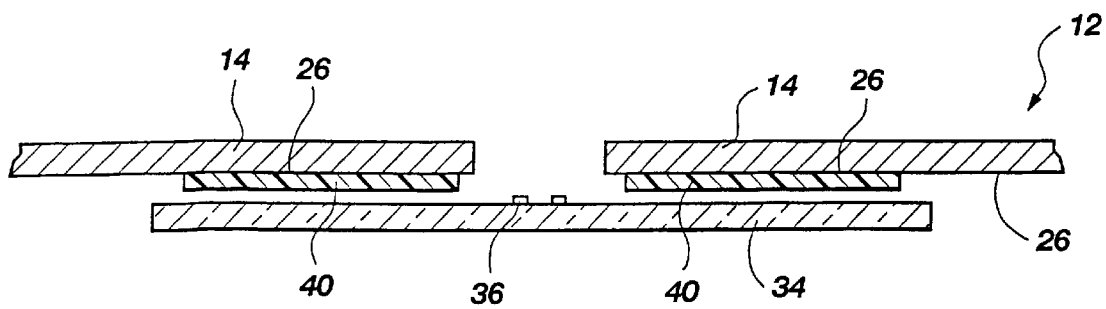
FIG. 3 is a cross sectional depiction of portions of a semiconductor device of the invention.

Referring to drawing FIG. 3, a semiconductor device 34 is illustrated in relation to the lead fingers 14 of a lead frame 12 having adhesive 40 applied to the attaching surfaces 26 thereof.

Figure 4:
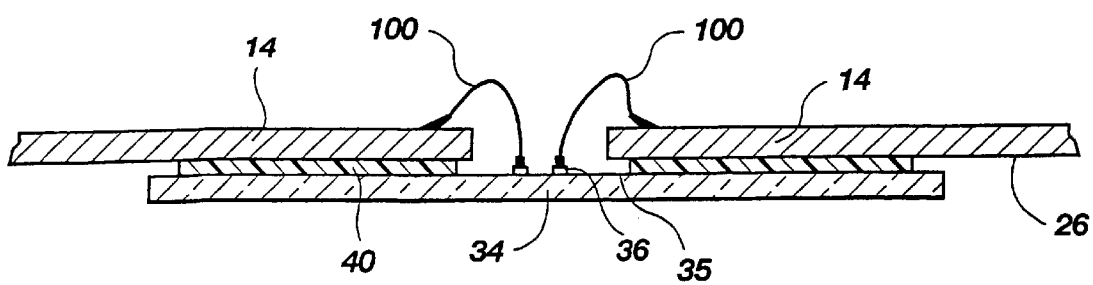
FIG. 4 is a cross sectional depiction of portions of a semiconductor device assembly of the invention with the semiconductor device and the lead frame in contact.

Referring to drawing FIG. 4, a semiconductor device 34 is illustrated having the active surface 35 thereof secured to the attaching surfaces 26 of the lead fingers 14 of a lead frame 12 (not shown) by the adhesive 40 located therebetween. As previously stated, the adhesive 40 may be applied to either the active surface 35 of the semiconductor device 34 or the attaching surfaces 26 of the lead fingers 14 of a lead frame 12. The lead fingers 14 and the semiconductor device 34 are pressed into contact with the adhesive 40, which is subsequently cured. Also illustrated, wire bonds 100 extend between and electrically connect the lead fingers 14 with the bond pads 36 on the active surface 35 of the semiconductor device 34.

The adhesives 40 and 68 are non-conductive polymers selected from that group or class of adhesives that is tacky and compliant at room temperature and is at the same time applicable at room temperature to a substrate through a stencil such as stencil 62. The adhesives 40 and 68 preferably have a first copolymer that is from the group of copolymers that includes isobutyl compounds and is specifically isobutyl acetal diphenol copolymer. The adhesive also contains a second material which is from a group of metal oxides that includes titanium dioxide. The preferred adhesive has from about 75 percent by weight or volume to about 95 percent by weight or volume of isobutyl acetal diphenol copolymer and respectively from about 25 percent to about 5 percent by weight or volume of titanium dioxide. The amounts of the two constituents may vary somewhat from those stated so long as the resulting composition has the requisite tackiness and compliancy to be suitable to secure a semiconductor device and a lead frame at room temperature.

A suitable adhesive is available from International Microelectronics Research Corporation of Nampa, Id. under the product designation EXP/NCBP-4143-33 and is also known as NON-CONDUCTIVE BUMP POLYMER 4243-33 (hereinafter referred to as the BUMP POLYMER). The BUMP POLYMER is particularly suitable because it may be applied at or near room temperature so that assembly can be effected at room temperature. Room temperature is generally deemed to be between 60° Fahrenheit (F.) and 85° F. and may range from as low as 50° F. to as high as 95° F.

To manufacture the desired semiconductor devices, the user provides the necessary lead frames in frame by frame sequence. Each lead frame has an attaching surface and connectors associated therewith. Semiconductor devices are also provided in a piece by piece sequence, each to be attached to an appropriate lead frame. Each semiconductor device has bond pads thereon configured for electrical connection to the lead fingers of its respective lead frame.

A non-conductive polymer adhesive from the group that is tacky and compliant at room temperature and is applicable through a stencil is selected and applied at room temperature to one of the semiconductor device and the attaching surface of the lead frame and preferably the attaching surface. The semiconductor device and the attaching surface are urged together to effect a desired connection between the active surface of the semiconductor device and the lead frame. Desirably, the adhesive selected is the isobutyl acetal diphenol copolymer with titanium dioxide as hereinbefore described. In a preferred method, the adhesive is urged through the stencil as it is applied to the attaching surface of the lead frame or the active surface of the semiconductor device.

As previously stated, wire bonds are used to form the electrical connections between the ends of the lead fingers of the lead frame and the bond pads on the active surface of the semiconductor device.

Those skilled in the art will appreciate that modifications may be made to the illustrated embodiment and the disclosed methods without departing from the spirit or principles of the invention and are not intended to limit the scope of the following claims.

What is claimed is:

1. A method for attaching a semiconductor die having an active surface to a portion of a lead frame having a plurality of lead fingers thereon, at least one lead finger of said plurality of lead fingers having an attaching surface, said method comprising:

selecting an adhesive from a group of adhesives comprising a tacky and compliant polymer adhesive at room temperature, said polymer adhesive including a first material from a group that includes isobutyl acetal diphenol copolymer and a second material that is from a group including metal oxides;

applying said polymer adhesive in one of at least one line of polymer adhesive and a plurality of beads of polymer adhesive on one of at least a portion of said active surface of said semiconductor die and said attaching surface of said at least one lead finger, said polymer adhesive at room temperature; and urging said active surface of said semiconductor die against said attaching surface of said at least one lead finger of said plurality of lead fingers of said lead frame while at room temperature for attaching said attaching surface of said at least one lead finger of said plurality of lead fingers of said lead frame and said active surface of said semiconductor die.

2. The method of claim 1, wherein a portion of said polymer adhesive has a first copolymer material from a group of copolymers that includes isobutyl compounds.

3. The method of claim 1, wherein a first portion of said polymer adhesive is isobutyl acetal diphenol copolymer.

4. The method of claim 1, wherein said polymer adhesive includes a group of metal oxides that includes titanium dioxide.

5. The method of claim 4, wherein said polymer adhesive has from about 75 percent to about 95 percent by weight of isobutyl acetal diphenol copolymer and from about 25 percent to about 5 percent by weight, respectively, of titanium dioxide.

6. A method of attaching a semiconductor die to at least a portion of a lead frame, said method comprising:

providing a lead frame having at least one lead having at least one attaching surface thereon;

providing a semiconductor die having an active surface and having at least one bond pad thereon;

selecting an adhesive which includes a first material from a group that includes an isobutyl acetal diphenol copolymer and a second material that is from a group including titanium dioxide;

applying said adhesive in one of at least one line of adhesive and a plurality of beads of adhesive on at least a portion of said active surface of said semiconductor die, said adhesive at room temperature; and urging said active surface of said semiconductor die and said attaching surface of said at least one lead of said lead frame together to attach said semiconductor die and said lead frame together, connecting said attaching surface of said at least one lead of said lead frame and said active surface of said semiconductor die having a portion of said at least one lead located adjacent said at least one bond pad on said active surface of said semiconductor die.

7. A method of attaching a portion of a semiconductor die to a portion of a lead frame for use in a semiconductor device assembly, said method comprising:

providing a lead frame having a plurality of lead fingers, each lead finger of said plurality of lead fingers having an attaching surface and an end portion;

providing a semiconductor die having an active surface and having a plurality of bond pads thereon;

selecting an adhesive that includes from about 75 percent to about 95 percent of isobutyl acetal diphenol copolymer and from about 25 percent to about 5 percent, respectively, of titanium dioxide;

applying said adhesive in one of a line of adhesive and a plurality of beads of adhesive to at least a portion of said active surface of said semiconductor die, said adhesive at room temperature; and urging said active surface of said semiconductor die and said attaching surfaces of said plurality of lead fingers of said lead frame together at room temperature to attach at least a portion of said semiconductor die and said lead frame together, connecting said attaching surfaces of said lead fingers of said plurality of lead fingers of said lead frame and said at least a portion of said active surface of said semiconductor die, at least some lead fingers of said plurality of lead fingers having said end portion thereof located adjacent a bond pad of said plurality of bond pads of said semiconductor die.

8. A method of attaching at least a portion of a semiconductor device to a portion of a lead frame for use in a semiconductor device assembly, said method comprising:

providing a lead frame having at least one lead having at least one attaching surface;

providing a semiconductor device having an attaching surface and having at least one bond pad thereon;

providing a stencil having a pattern therein;

selecting a polymer adhesive from a group that is tacky and compliant at room temperature for application to a substrate using a stencil;

applying said polymer adhesive in one of at least one line of adhesive and a plurality of beads of adhesive to a portion of said attaching surface of said semiconductor device through said stencil, said polymer adhesive at room temperature;

positioning said at least one attaching surface of said at least one lead of said lead frame and said attaching surface of said semiconductor device relative to each other; and urging said attaching surface of said semiconductor device and said at least one attaching surface of said at least one lead of said lead frame together to attach said semiconductor device and said lead frame together having a portion of said at least one lead of said lead frame located adjacent said at least one bond pad of said semiconductor device.

9. A method of attaching at least a portion of a semiconductor device to a portion of a lead frame for use in a semiconductor device assembly, said method comprising:

providing a lead frame having at least one lead having at least one attaching surface;

providing a semiconductor device having an attaching surface and having at least one bond pad thereon;

providing a stencil having a pattern therein;

selecting an adhesive including a first material from a group that includes isobutyl acetal diphenol copolymer and a second material that is from a group that includes titanium dioxide;

applying said adhesive in one of at least one line of adhesive and a plurality of beads of adhesive through said stencil to at least a portion of said attaching surface of said semiconductor device, said adhesive at room temperature;

positioning said at least one attaching surface of said at least one lead of said lead frame and said attaching surface of said semiconductor device relative to each other; and urging said attaching surface of said semiconductor device and said at least one attaching surface of said at least one lead of said lead frame together at room temperature to attach said semiconductor device and said lead frame together having a portion of said at least one lead of said lead frame located adjacent said at least one bond pad of said semiconductor device.

10. A method of attaching at least a portion of a semiconductor device to a portion of a lead frame for use in a semiconductor device assembly, said method comprising:

providing a lead frame having at least one lead having at least one attaching surface;

providing a semiconductor device having an attaching surface and having at least one bond pad thereon;

providing a stencil having a pattern therein;

selecting an adhesive including from about 75 percent to about 95 percent of isobutyl acetal diphenol copolymer and from about 25 percent to about 5 percent, respectively, of titanium dioxide;

applying said adhesive through said stencil in one of at least one line of adhesive and a plurality of beads of adhesive to said attaching surface of said semiconductor device, said adhesive at room temperature;

positioning said lead frame and said semiconductor device relative to each other; and urging said semiconductor device and said lead frame together to attach said semiconductor device and said lead frame using said adhesive having a portion of said at least one lead located adjacent said at least one bond pad of said semiconductor device.

* * * * *